United States Patent
Sato et al.

(10) Patent No.: US 10,714,355 B2
(45) Date of Patent: Jul. 14, 2020

(54) PLASMA ETCHING METHOD AND PLASMA ETCHING APPARATUS

(71) Applicant: Tokyo Electron Limited, Tokyo (JP)

(72) Inventors: Hiroki Sato, Miyagi (JP); Hisashi Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 28 days.

(21) Appl. No.: 16/018,466

(22) Filed: Jun. 26, 2018

(65) Prior Publication Data
US 2019/0006186 A1    Jan. 3, 2019

(30) Foreign Application Priority Data
Jun. 29, 2017   (JP) .................. 2017-127434

(51) Int. Cl.
| | |
|---|---|
| *H01L 21/3065* | (2006.01) |
| *H01J 37/32* | (2006.01) |
| *H01L 21/683* | (2006.01) |
| *H01L 21/67* | (2006.01) |
| *H01L 21/311* | (2006.01) |

(52) U.S. Cl.
CPC .... *H01L 21/3065* (2013.01); *H01J 37/32449* (2013.01); *H01J 37/32513* (2013.01); *H01J 37/32568* (2013.01); *H01J 37/32724* (2013.01); *H01J 37/32853* (2013.01); *H01L 21/31116* (2013.01); *H01L 21/67109* (2013.01); *H01L 21/67248* (2013.01); *H01L 21/6831* (2013.01); *H01L 21/6833* (2013.01); *H01L 21/30655* (2013.01)

(58) Field of Classification Search
CPC ........... H01J 37/32449; H01J 37/32513; H01J 37/32568; H01J 37/32724; H01J 37/32853
See application file for complete search history.

(56) References Cited

U.S. PATENT DOCUMENTS

| | | | | |
|---|---|---|---|---|
| 7,857,982 B2* | 12/2010 | Abatchev | .......... | H01L 21/30655 216/13 |
| 7,910,489 B2* | 3/2011 | Kim | .................. | H01L 21/31116 134/1.1 |
| 2014/0167228 A1* | 6/2014 | Lee | .................. | H01J 37/32091 257/632 |
| 2017/0076945 A1* | 3/2017 | Hudson | ............. | H01J 37/32366 |

FOREIGN PATENT DOCUMENTS

JP    2016-225437 A    12/2016

* cited by examiner

*Primary Examiner* — Anita K Alanko
(74) *Attorney, Agent, or Firm* — Pearne & Gordon LLP

(57) ABSTRACT

A shape of a hole can be improved. The plasma etching method includes a recess forming of forming a recess having a depth smaller than a thickness of a silicon oxide film by etching the silicon oxide film by plasma; a removing process of removing a reaction product adhering to the recess by plasma generated from a fluorocarbon gas; and a penetrating process of forming a hole penetrating the silicon oxide film by etching the recess, from which the reaction product is removed, by plasma.

17 Claims, 6 Drawing Sheets

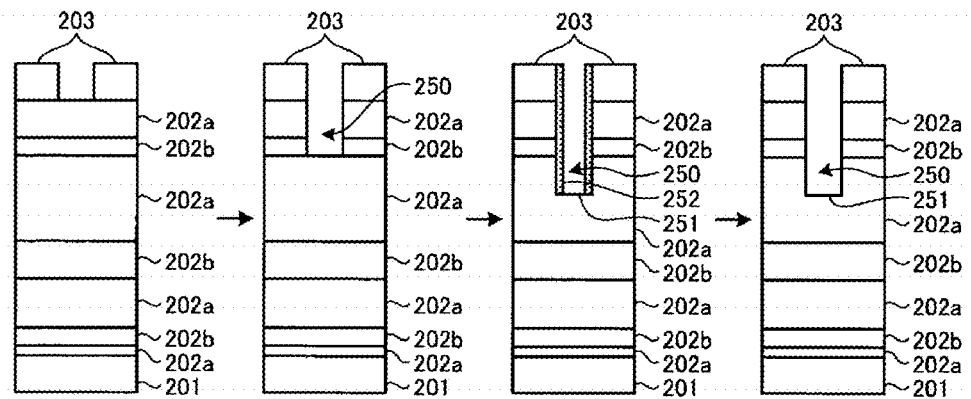
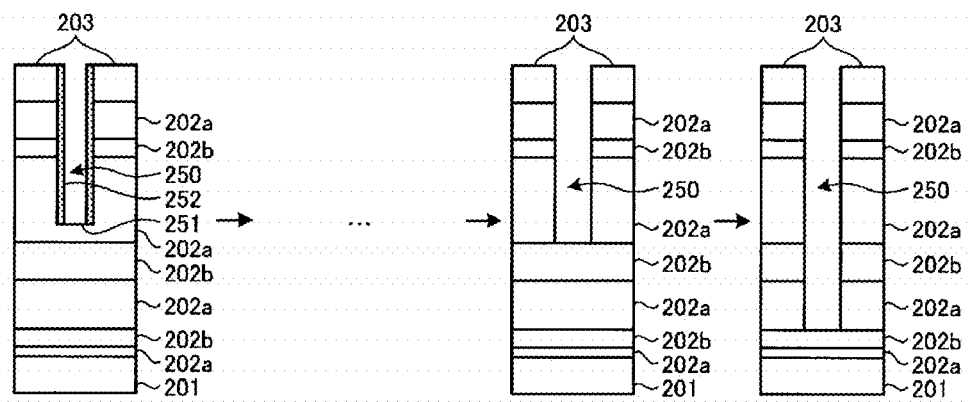
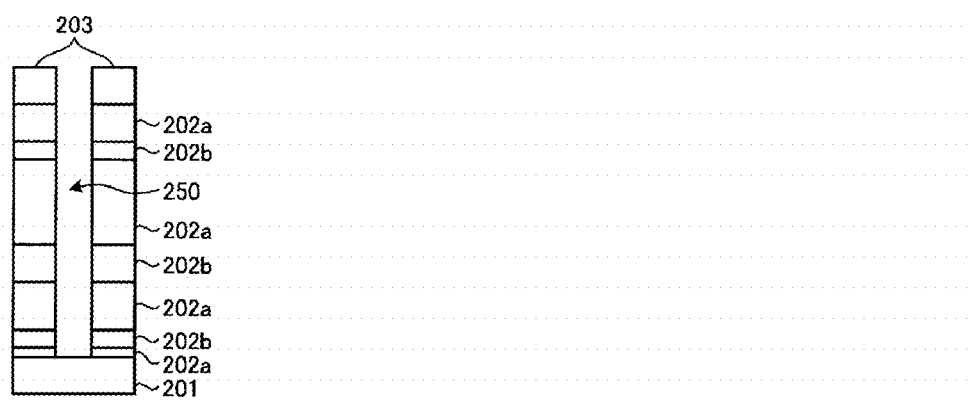

PLASMA ETCHING METHOD AND PLASMA ETCHING APPARATUS

CROSS-REFERENCE TO RELATED APPLICATION

This application claims the benefit of Japanese Patent Application No. 2017-127434 filed on Jun. 29, 2017, the entire disclosures of which are incorporated herein by reference.

TECHNICAL FIELD

The embodiments described herein pertain generally to a plasma etching method and a plasma etching apparatus.

BACKGROUND

When forming a hole in a processing target film in an etching process using plasma, it is known that a reaction product generated from the processing target film adheres to the hole, causing the hole to be clogged. As a countermeasure to the clogging of the hole, Patent Document 1 discloses a technique of adjusting an etching rate of the processing target film in the etching process by controlling a temperature of an electrostatic chuck on which a processing target object is placed.

Patent Document 1: Japanese Patent Laid-open Publication No. 2016-225437

In the aforementioned technique of adjusting the temperature of the electrostatic chuck, however, although the clogging of the hole may be suppressed to some degree, an apparatus configuration becomes complicated. That is, in the aforementioned prior art, since the temperature of the electrostatic chuck is adjusted by controlling a flow rate of a coolant flown in a coolant path formed within a base configured to support the electrostatic chuck, the apparatus configuration applied to the control of the flow rate of the coolant becomes highly complicated.

In view of this, it may be considered to use a method of removing the reaction product adhering to the hole by plasma of a processing gas instead of performing the temperature adjustment of the electrostatic chuck. In this case, $Ar/O_2$ is generally used as the processing gas to remove the reaction product adhering to the hole, particularly, a reaction product which contains carbon. In case of removing the reaction product adhering to the hole by using plasma of the $Ar/O_2$, however, it is difficult to remove a reaction product which contains silicon, so that roundness of the hole may be deteriorated. Therefore, it is required to improve the shape of the hole.

SUMMARY

In an exemplary embodiment, a plasma etching method includes a recess forming process of forming a recess having a depth smaller than a thickness of a silicon oxide film by etching the silicon oxide film by plasma; a removing process of removing a reaction product adhering to the recess by plasma generated from a fluorocarbon gas; and a penetrating process of forming a hole penetrating the silicon oxide film by etching the recess, from which the reaction product is removed, by plasma.

According to the plasma etching method of the exemplary embodiment, it is possible to improve the shape of the hole.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4A to FIG. 4H are diagrams illustrating examples of a cross section of the wafer W obtained after individual processes shown in FIG. 3 are performed;

DETAILED DESCRIPTION

Figure 1:
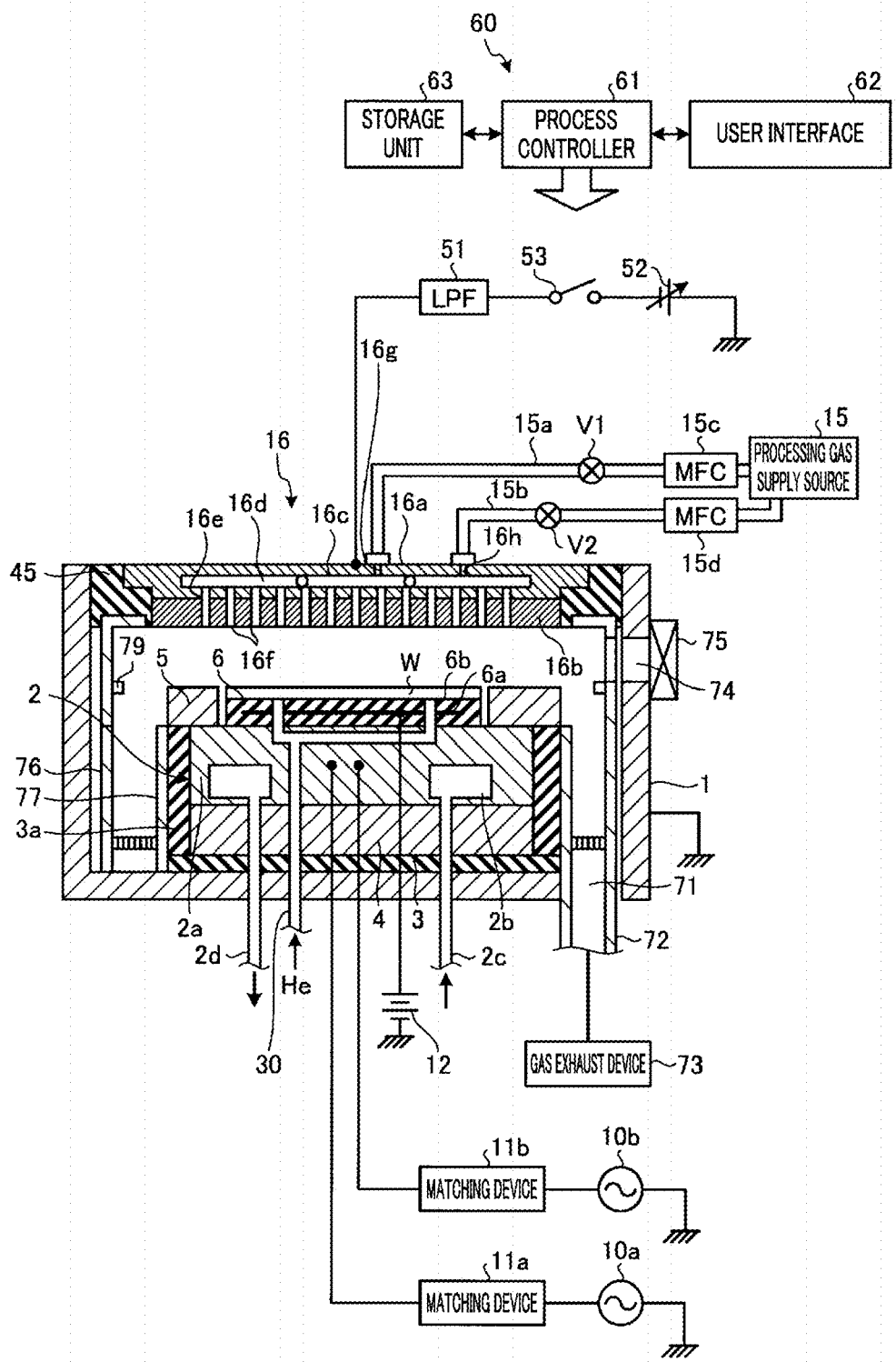
FIG. 1 is a schematic cross sectional view illustrating a plasma etching apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a plasma etching method and a plasma etching apparatus according to an exemplary embodiment will be explained in detail with reference to the accompanying drawings. In the various drawings, same or corresponding parts will be assigned same reference numerals.

[Configuration of Plasma Etching Apparatus]

FIG. 1 is a schematic cross sectional view illustrating a plasma etching apparatus according to an exemplary embodiment. The plasma etching apparatus shown in FIG. 1 is configured as a plasma etching apparatus using capacitively coupled plasma (CCP). The plasma etching apparatus shown in FIG. 1 is equipped with a processing chamber 1 which is hermetically sealed and electrically grounded. This processing chamber 1 has a cylindrical shape and is made of, by way of non-limiting example, aluminum having an anodically oxidized film on a surface thereof. A mounting table 2 configured to support a semiconductor wafer (hereinafter, simply referred to as "wafer") as a processing target object is provided within the processing chamber 1.

The mounting table 2 has a base 2a made of a conductive metal such as, but not limited to, aluminum, and has a function as a lower electrode. This mounting table 2 is supported on a conductive supporting table 4 with an insulating plate 3 therebetween. Further, a focus ring 5 made of, for example, single crystalline silicon is provided on a peripheral portion of a top surface of the mounting table 2. Further, a cylindrical inner wall member 3a made of, by way of non-limiting example, quartz is configured to surround the mounting table 2 and the supporting table 4.

A shower head 16 having a function as an upper electrode is provided above the mounting table 2, facing the mounting table 2 in parallel, that is, facing the wafer W placed on the mounting table 2. The shower head 16 and the mounting table 2 serve as a pair of electrodes (the upper electrode and the lower electrode). The base 2a of the mounting table 2 is connected with a first high frequency power supply 10a via a first matching device 11a. Further, the base 2a of the mounting table 2 is also connected with a second high frequency power supply 10b via a second matching device 11b. The first high frequency power supply 10a is for plasma generation, and is configured to supply a high frequency power having a preset frequency (e.g., 100 MHz) to the base 2a of the mounting table 2. Further, the second high frequency power supply 10b is for ion attraction (bias) and is configured to supply a high frequency power having a predetermined frequency (e.g., 3.2 MHz) lower than the frequency of the first high frequency power supply 10a to the base 2a of the mounting table 2.

An electrostatic chuck 6 configured to attract the wafer W electrostatically is provided on the top surface of the mounting table 2. This electrostatic chuck 6 has a structure in which an electrode 6a is embedded in an insulator 6b, and a DC power supply 12 is connected to the electrode 6a. As a DC voltage is applied to the electrode 6a from the DC power supply 12, the wafer W is attracted to the electrostatic chuck 6 by a Coulomb force.

A coolant path 2b is formed within the mounting table 2, and a coolant inlet line 2c and a coolant outlet line 2d are connected to the coolant path 2b. By circulating a coolant such as Galden through the coolant path 2b, the supporting table 4 and the mounting table 2 can be controlled to have a preset temperature. Further, a backside gas supply line 30 for supplying a cold heat transfer gas (backside gas) such as a helium gas to a rear surface of the wafer W is configured to penetrate the mounting table 2 and so forth. This backside gas supply line 30 is connected to a non-illustrated backside gas supply source. With this configuration, the wafer W attracted to and held on the top surface of the mounting table 2 by the electrostatic chuck 6 can be controlled to have a preset temperature.

The aforementioned shower head 16 is provided at a ceiling of the processing chamber 1. The shower head 16 is equipped with a main body 16a and a ceiling plate 16b configured as an electrode plate, and is supported at an upper portion of the processing chamber 1 with an insulating member 45 therebetween. The main body 16a is made of a conductive material such as, but not limited to, aluminum having an anodically oxidized surface thereon, and configured to hold the ceiling plate 16b from thereabove in a detachable manner. The ceiling plate 16b is made of a silicon-containing material such as, but not limited to, quartz.

Gas diffusion spaces 16c and 16d are provided within the main body 16a, and a multiple number of gas through holes 16e is formed at a bottom portion of the main body 16a to be located under the gas diffusion spaces 16c and 16d. The gas diffusion space is divided in two: the gas diffusion space 16c provided at a central portion thereof and the gas diffusion space 16d provided at a peripheral portion thereof. With this configuration, a processing gas supply state at the central portion and the peripheral portion can be changed independently.

Furthermore, gas inlet holes 16f are formed through the ceiling plate 16b in a thickness direction thereof to communicate with the gas through holes 16e. With this configuration, a processing gas supplied into the gas diffusion spaces 16c and 16d are introduced into the processing chamber 1 through the gas through holes 16e and the gas inlet holes 16f while being distributed in a shower shape. Further, the main body 16a or the like is equipped with a temperature control device such as a non-illustrated heater or a non-illustrated pipeline for circulating a coolant, so that the shower head 16 can be adjusted to have a required temperature during a plasma etching processing.

The main body 16a is provided with two gas inlet openings 16g and 16h through which the processing gas is introduced into the gas diffusion spaces 16c and 16d, respectively. One ends of gas supply lines 15a and 15b are respectively connected to the gas inlet openings 16g and 16h, and the other ends of the gas supply lines 15a and 15b are connected to a processing gas supply source 15 configured to supply the processing gas for etching. The processing gas supply source 15 is an example of a gas supply unit. The gas supply line 15a is provided with a mass flow controller (MFC) 15c and an opening/closing valve V1 in sequence from the upstream side. The gas supply line 15b is provided with a mass flow controller (MFC) 15d and an opening/closing valve V2 in sequence from the upstream side.

The processing gas for plasma etching is supplied from the processing gas supply source 15 into the gas diffusion spaces 16c and 16d through the gas supply lines 15a and 15b, respectively, and is then supplied from these gas diffusion spaces 16c and 16d into the processing chamber 1 through the gas through holes 16e and the gas inlet holes 16f while being distributed in the shower shape.

The shower head 16 serving as the upper electrode is connected with a variable DC power supply 52 via a low pass filter (LPF) 51. The variable DC power supply 52 is configured to switch on and off a power feed with an on/off switch 53. A current/voltage of the variable DC power supply 52 and an on/off operation of the on/off switch 53 are controlled by a control unit 60 to be described later. Further, as will be described later, when plasma is generated in a processing space as the high frequency powers from the first high frequency power supply 10a and the second high frequency power supply 10b are applied to the mounting table 2, the on/off switch 53 is turned on by the control unit 60 if necessary, so that a preset DC voltage is applied to the shower head 16 serving as the upper electrode.

A gas exhaust opening 71 is formed at a bottom portion of the processing chamber 1, and this gas exhaust opening 71 is connected with a gas exhaust device 73 via a gas exhaust line 72. The gas exhaust device 73 is equipped with a vacuum pump and is capable of decompressing the inside of the processing chamber 1 to a preset vacuum level by operating this vacuum pump. The gas exhaust device 73 is an example of a gas exhaust unit. Meanwhile, a carry-in/out opening 74 for the wafer W is provided at a sidewall of the processing chamber 1, and a gate valve 75 configured to open/close the carry-in/out opening 74 is provided at the carry-in/out opening 74.

Reference numerals 76 and 77 denote deposition shields provided in a detachable manner. The deposition shield 76 is provided along an inner wall surface of the processing chamber 1 and configured to suppress an etching byproduct (deposit) from adhering to the processing chamber 1. Further, the deposition shield 77 is configured to cover outer surfaces of the mounting table 2 serving as the lower electrode, the inner wall member 3a and the supporting table 4. Further, a conductive member (GND block) 79, which is DC-connected to the ground, is provided at a position of the deposition shield 76 which is substantially on a level with the wafer W, and configured to suppress an abnormal discharge.

An overall operation of the plasma etching apparatus having the above-described configuration is controlled by the control unit 60. The control unit 60 is equipped with a process controller 61 which has a CPU and is configured to control the individual components of the plasma etching apparatus; a user interface 62; and a storage unit 63.

The user interface 62 includes a keyboard through which a process manager inputs commands or the like to manage the plasma etching apparatus; and a display configured to visually display an operational status of the plasma etching apparatus; and so forth.

The storage unit 63 has stored thereon control programs (software) for implementing various processings performed in the plasma etching apparatus under the control of the process controller 61; and recipes in which processing condition data and the like are recorded. A required recipe is retrieved from the storage unit 63 in response to an instruction from the user interface 62 or the like and executed by the process controller 61, so that a required processing is performed in the plasma etching apparatus under the control of the process controller 61. Further, the control programs and the recipes such as the processing condition data may be used by being stored in a computer-readable recording medium (e.g., a hard disk, a CD, a flexible disk, a semiconductor memory, etc.), or may be used on-line by being received from another apparatus through, for example, a dedicated line, whenever necessary.

By way of example, the control unit 60 controls the individual components of the plasma etching apparatus to perform a plasma etching method to be described later. As a specific example, the control unit 60 forms a recess having a depth smaller than a thickness of a silicon oxide film by plasma-etching the silicon oxide film. Then, the control unit 60 removes, by plasma of a fluorocarbon gas, a reaction product which adheres to the recess as the silicon oxide film is etched. Then, the control unit 60 forms a hole through the silicon oxide film by further plasma-etching the recess from which the reaction product is removed. Here, the silicon oxide film is included in a multilayered film composed of a silicon oxide film and a silicon nitride film alternately stacked on top of each other.

[Structure of Wafer W]

Figure 2:
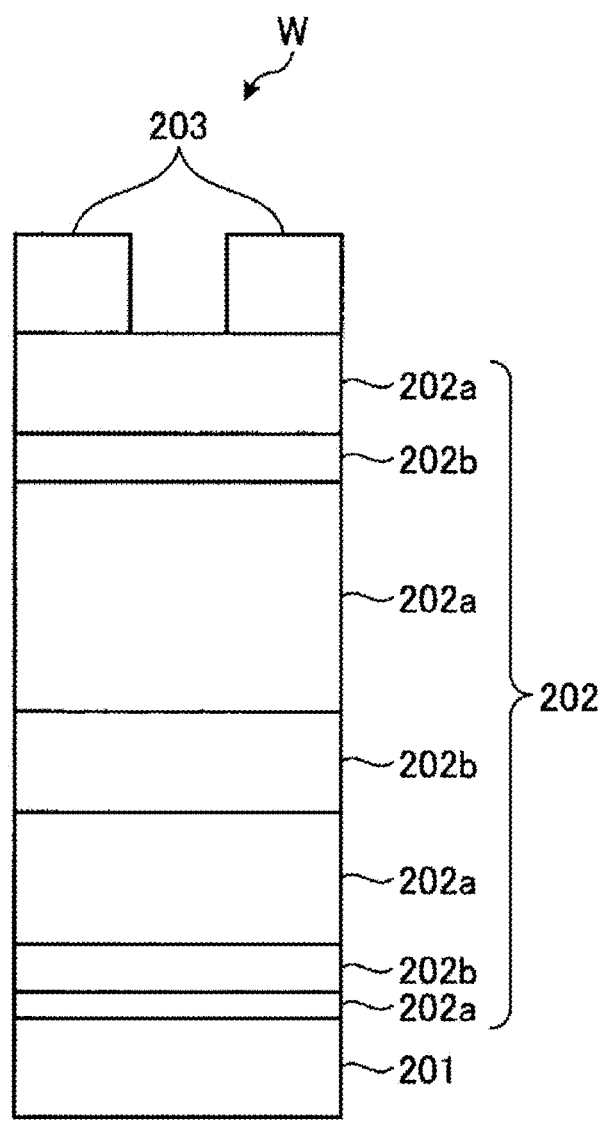
FIG. 2 is a diagram illustrating an example structure of a wafer to be etched in the plasma etching apparatus according to the exemplary embodiment.

FIG. 2 is a diagram illustrating an example of a structure of the wafer W to be etched in the plasma etching apparatus according to the exemplary embodiment.

As depicted in FIG. 2, for example, the wafer W has a silicon (Si) substrate 201 and a multilayered film 202 formed on the Si substrate 201. A carbon film 203 having a preset pattern is formed on the multilayered film 202.

As shown in FIG. 2, for example, the multilayered film 202 has a structure in which silicon oxide films 202a and silicon nitride films 202b are alternately stacked on top of each other. In the present exemplary embodiment, the silicon oxide film 202a is provided at the topmost and the bottommost layers of the multilayered film 202. According to the present exemplary embodiment, the silicon oxide films 202a of the multilayered film 202 are provided in, e.g., four layers, and the silicon nitride films 202b are provided in, e.g., three layers. However, the stacking numbers of the silicon oxide films 202a and the silicon nitride films 202b included in the multilayered film 202 are not limited thereto, and may be more than or less than the examples shown in FIG. 2. In the following, for the convenience of explanation, the four layers of the silicon oxide films 202a belonging to the multilayered film 202 will be appropriately referred to as "first silicon oxide film 202a", "second silicon oxide film 202a", "third silicon oxide film 202a" and "fourth silicon oxide film 202a" in sequence from the top. Further, the three layers of the silicon nitride films 202b belonging to the multilayered film 202 will be appropriately referred to as "first silicon nitride film 202b", "second silicon nitride film 202b", and "third silicon nitride film 202b" in sequence from the top.

In the present exemplary embodiment, the first silicon oxide film 202a, the second silicon oxide film 202a and the third silicon oxide film 202a may be, by way of example, TEOS (tetraethoxysilane), and the fourth silicon oxide film 202a is, for example, a thermal oxide film. Further, in the present exemplary embodiment, the first silicon nitride film 202b, the second silicon nitride film 202b and the third silicon nitride film 202b may be, by way of example, but not limitation, SiN (silicon nitride).

Moreover, in the present exemplary embodiment, the first silicon oxide film 202a has a thickness of, e.g., 365 nm; the second silicon oxide film 202a, a thickness of, e.g., 6100 nm; the third silicon oxide film 202a, a thickness of, e.g., 245 nm; and the fourth silicon oxide film 202a, a thickness of, e.g., 10 nm. Further, in the present exemplary embodiment, the first silicon nitride film 202b has a thickness of, e.g., 30 nm; the second silicon nitride film 202b, a thickness of, e.g., 110 nm; and the third silicon nitride film 202b, a thickness of, e.g., 30 nm. Furthermore, in the present exemplary embodiment, the carbon film 203 has a thickness of, e.g., 2500 nm.

[Plasma Etching Method]

Figure 3:
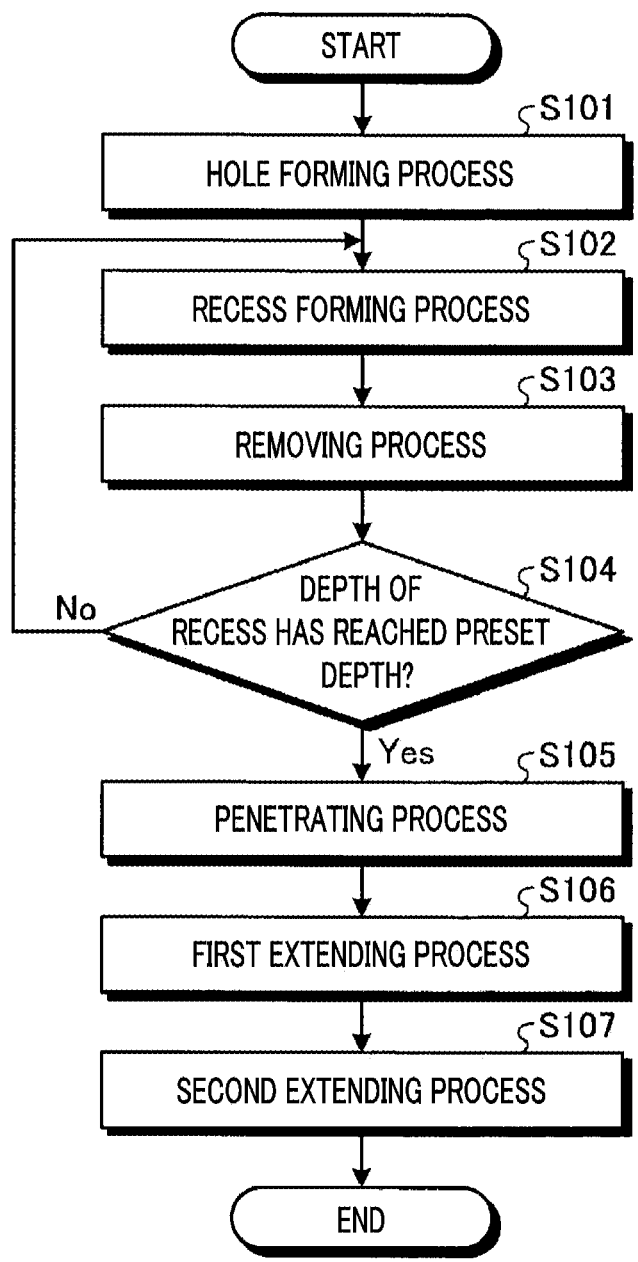
FIG. 3 is a flowchart illustrating an example process sequence of a plasma etching method according to the exemplary embodiment.

Now, individual processes of the plasma etching method according to the exemplary embodiment will be explained. FIG. 3 is a flowchart illustrating an example process sequence of the plasma etching method according to the present exemplary embodiment. FIG. 4A to FIG. 4H are diagrams illustrating examples of a cross section of the wafer W obtained after the individual processes shown in FIG. 3 are performed.

In the plasma etching method according to the present exemplary embodiment, the wafer W as a processing target object is first carried into the processing chamber 1 and placed on the mounting table 2. In this stage, the cross section of the wafer W is in in a state as illustrated in FIG. 4A, for example.

Subsequently, the control unit 60 performs a hole forming process of forming a hole by etching the first silicon oxide film 202a and the first silicon nitride film 202b by plasma generated from a first processing gas while using the carbon film 203 as a mask (process S101). To elaborate, the control unit 60 decompresses the inside of the processing chamber 1 to a preset pressure by the gas exhaust device 73, supplies the first processing gas into the processing chamber 1 from the processing gas supply source 15, and etches the first silicon oxide film 202a and the first silicon nitride film 202b by the plasma of the first processing gas. As a result, the hole corresponding to the pattern of the carbon film 203 is formed in the first silicon oxide film 202a and the first silicon nitride film 202b.

By way of non-limiting example, the control unit 60 performs the hole forming process under the following conditions.

Internal pressure of the processing chamber 1: 30 mT
First high frequency power supplied to lower electrode: 400 W
Second high frequency power supplied to lower electrode: 11000 W
Processing gas and flow rate: $C_4F_6/C_4F_8/CH_2F_2/Ar/O_2$=10 sccm/40 sccm/50 sccm/500 sccm/50 sccm
Temperature of lower electrode: 40° C.
Processing time: 70 sec The cross section of the wafer W obtained after the completion of the hole forming process shown in the process S101 is in a state as shown in FIG. 4B, for example. That is, as the hole forming process is performed, a hole 250 is formed through the first silicon oxide film 202a and the second silicon nitride film 202b.

Subsequently, the control unit 60 performs a recess forming process of forming a recess having a depth smaller than a thickness of the second silicon oxide film 202a by etching the second silicon oxide film 202a by plasma generated from a second processing gas (process S102). To be specific, the control unit 60 decompresses the processing chamber 1 by the gas exhaust device 73, supplies the second processing gas into the processing chamber 1 from the processing gas supply source 15, and etches the second silicon oxide film 202a down to a preset point thereof by the plasma of the second gas. As a result, the hole 250 formed in the first silicon oxide film 202a and the first silicon nitride film 202b through the hole forming process is extended, so that the recess having the depth smaller than the thickness of the second silicon oxide film 202a is formed in the second silicon oxide film 202a.

By way of example, the control unit 60 performs the recess forming process under the following conditions.

Internal pressure of the processing chamber 1: 20 mT
First high frequency power supplied to lower electrode: 300 W
Second high frequency power supplied to lower electrode: 18000 W
Processing gas and flow rate: $C_4F_6/CO/O_2$=70 sccm/320 sccm/48 sccm
Temperature of lower electrode: 40° C.
Processing time: 270 sec The cross section of the wafer W obtained after the completion of the recess forming process shown in the process S102 is in a state as shown in FIG. 4C, for example. That is, as the recess forming process is performed, the hole 250 is extended only to the extent that the hole 250 does not penetrate the second silicon oxide film 202a, so that a recess 251 having a depth smaller than the thickness of the second silicon oxide film 202a is formed in the second silicon oxide film 202a. Here, since the second silicon oxide film 202a has the largest thickness among the four layers of silicon oxide films 202a belonging to the multilayered film 202, a silicon-containing reaction product is generated in a relatively large amount. A reaction byproduct 252 generated as the second silicon oxide film 202a is etched adheres to the recess 251 and a sidewall of the hole 252 including the recess 251, as illustrated in FIG. 4C.

Subsequently, the control unit 60 performs a removing process of removing the reaction product adhering to the recess 251 by plasma generated from a fluorocarbon gas (process S103). To elaborate, the control unit 60 decompresses the processing chamber 1 by the gas exhaust device 73, supplies the fluorocarbon gas into the processing chamber 1 from the processing gas supply source 15, and removes the reaction product stuck to the recess 251 by the plasma of the fluorocarbon gas. The fluorocarbon gas may be, by way of example, but not limitation, $CF_4$, $C_3F_8$, $C_4F_8$ or $C_4F_8$.

By way of example, the control unit 60 performs the removing process under the following conditions.

Internal pressure of the processing chamber 1: 30 mT
First high frequency power supplied to lower electrode: 600 W
Second high frequency power supplied to lower electrode: 150 W
Processing gas and flow rate: $CF_4$=250 sccm
Temperature of lower electrode: 60° C.
Processing time: 8 sec The cross section of the wafer W obtained after the completion of the removing process shown in the process S103 is as illustrated in FIG. 4D, for example. That is, as the removing process is performed, the reaction product 252 adhering to the recess 251 and the hole 250 including the recess 251 is removed. Since the reaction product 252 adhering to the recess 251 contains silicon, it is possible to remove the reaction product 252 from the recess 251 efficiently by using the fluorocarbon gas in the removing process.

Thereafter, the control unit 60 determines whether the recess 251 has reached a preset depth (process S104). The control unit 60 may detect whether the recess 251 has reached the preset depth by determining whether a preset time has passed by. Here, this preset time is set as a time period which will be taken for the etching to progress to the preset depth. If the recess 251 is found not to have reached the preset depth (process S104: No), the control unit 60 performs the recess forming process shown in the process S102 again.

The cross section of the wafer W obtained after the recess forming process shown in the process S102 is performed again is as shown in FIG. 4E. That is, as the recess forming process is performed again, the hole 250 is further extended to the extent that it still does not penetrate the second silicon oxide film 202a, so that the depth of the recess 251 is increased.

Thereafter, the control unit 60 repeats the recess forming process and the removing process alternately multiple times until the recess 251 reaches the preset depth (process S104: No, process S102 and process S103). As the recess forming process and the removing process are alternately repeated the multiple times, the hole 250 can be extended while removing the reaction product 252 adhering to the recess 251. Therefore, the roundness of the hole 250 can be further improved.

Meanwhile, if the recess 251 has reached the preset depth (process S104: Yes), the control unit 60 performs a penetrating process of allowing the hole 250 to penetrate the second silicon oxide film 202a by plasma-etching the recess 251 from which the reaction product 252 is removed (process S105). To elaborate, the control unit 60 decompresses the processing chamber 1 by the gas exhaust device 73, supplies the second processing gas into the processing chamber 1 from the processing gas supply source 15, and etches the recess 251 by the plasma of the second processing gas. As a result, the recess 251 is extended, so that the hole penetrating the second silicon oxide film 202a is obtained.

By way of example, the control unit 60 performs the penetrating process under the following conditions.

Internal pressure of the processing chamber 1: 20 mT
First high frequency power supplied to lower electrode: 300 W
Second high frequency power supplied to lower electrode: 18000 W
Processing gas and flow rate: $C_4F_6/CO/O_2$=70 sccm/320 sccm/48 sccm
Temperature of lower electrode: 40° C.
Processing time: 100 sec The cross section of the wafer W obtained after the completion of the penetrating process shown in the process S105 is as shown in FIG. 4F. That is, as the penetrating process is performed, the hole 250 is made to penetrate the second silicon oxide film 202a, so that the second silicon nitride film 202b formed under the second silicon oxide film 202a is exposed through the hole 250.

Subsequently, the control unit 60 performs a first extending process of extending the hole 250 by etching the exposed second silicon nitride film 202b and the third silicon oxide film 202a formed under the second silicon nitride film 202b by plasma generated from a third processing gas (process S106). To elaborate, the control unit 60 decompresses the processing chamber 1 by the gas exhaust device 73, supplies the third processing gas into the processing chamber 1 from the processing gas supply source 15, and etches the second silicon nitride film 202b and the third silicon oxide film 202a by the plasma of the third processing gas. As a result, the hole 250 formed through the penetrating process is extended to penetrate the second silicon nitride film 202b and the third silicon oxide film 202a.

By way of example, the control unit 60 performs the first extending process under the following conditions.

Internal pressure of the processing chamber 1: 25 mT
First high frequency power supplied to lower electrode: 2000 W
Second high frequency power supplied to lower electrode: 300 W
Processing gas and flow rate: $C_4F_8/CH_2F_2/Ar$=50 sccm/100 sccm/150 sccm
Temperature of lower electrode: 80° C.
Processing time: 30 sec The cross section of the wafer W obtained after the completion of the first extending process shown in the process S106 is as shown in FIG. 4G. That is, as the first extending process is performed, the hole 250 is made to penetrate the second silicon nitride film 202b and the third silicon oxide film 202a, so that the third silicon nitride film 202b formed under the third silicon oxide film 202a is exposed through the hole 250.

Afterwards, the control unit 60 performs a second extending process of further extending the hole 250 by etching the third silicon nitride film 202b exposed through the extended hole 250 and the fourth silicon oxide film 202a formed under the third silicon nitride film 202b by plasma generated from a fourth processing gas (process S107). To elaborate, the control unit 60 decompresses the processing chamber 1 by the gas exhaust device 73, supplies the fourth processing gas into the processing chamber 1 from the processing gas supply source 15, and etches the third silicon nitride film 202b and the fourth silicon oxide film 202a by the plasma of the fourth processing gas. As a result, the hole 250 extended through the first extending process is further extended to penetrate the third silicon nitride film 202b and the fourth silicon oxide film 202a.

By way of example, the control unit 60 performs the second extending process under the following conditions.

Internal pressure of the processing chamber 1: 15 mT
First high frequency power supplied to lower electrode: 1500 W
Second high frequency power supplied to lower electrode: 2750 W
Processing gas and flow rate: $C_4F_8/CH_2F_2/Ar/O_2$=50 sccm/30 sccm/50 sccm/32 sccm
Temperature of lower electrode: 80° C.
Processing time: 90 sec The cross section of the wafer W obtained after the completion of the second extending process shown in the process S106 is as shown in FIG. 4H. That is, as the second extending process is performed, the hole 250 is made to penetrate the third silicon nitride film 202b and the fourth silicon oxide film 202a (that is, the hole 250 is made to penetrate the entire multilayered film 202), so that the Si substrate 201 is exposed through the hole 250.

[Comparison of Hole Shapes]

Figure 5:
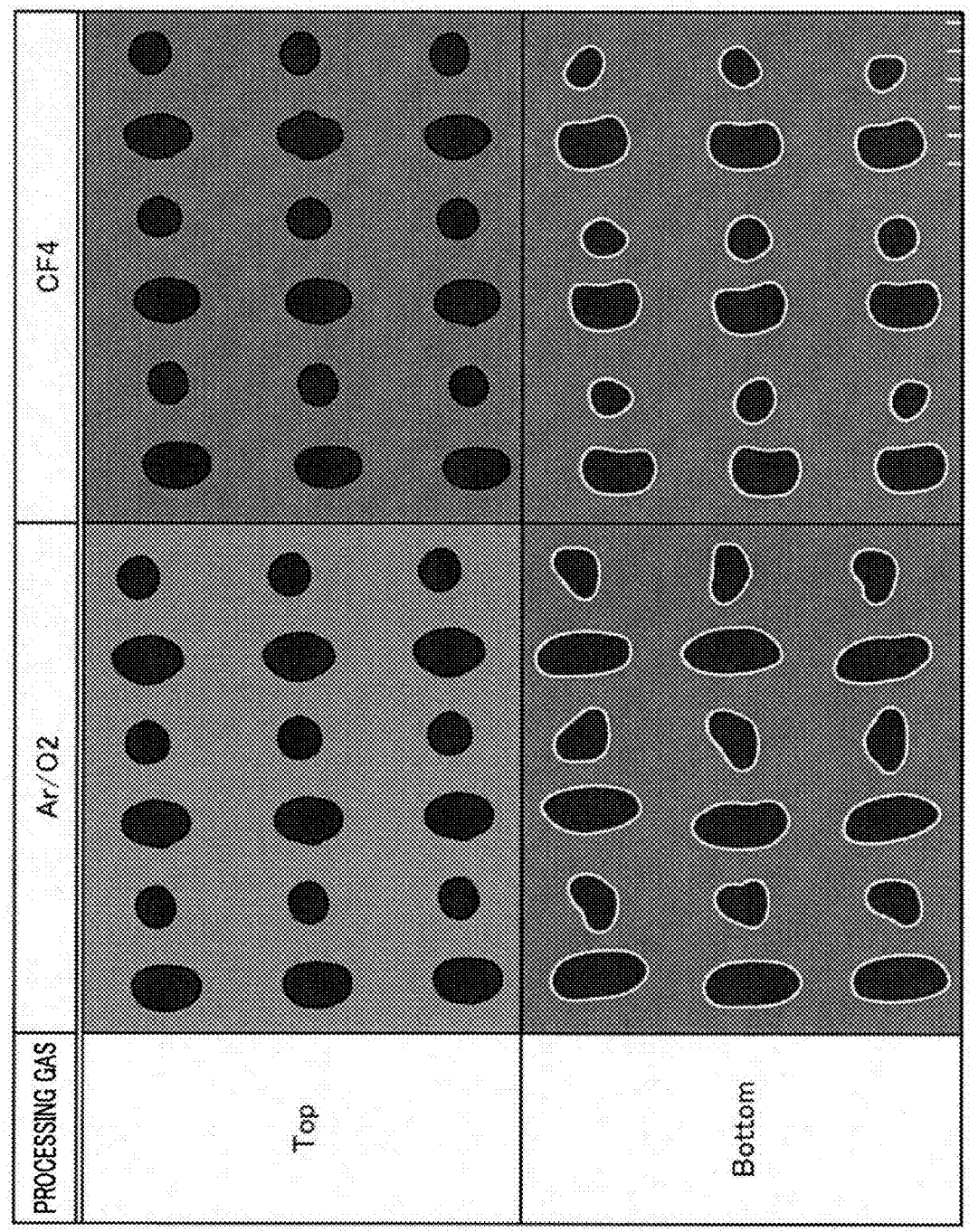
FIG. 5 is a diagram illustrating examples of a hole shape in each of cases where different kinds of processing gases are used in a removing process.

FIG. 5 is a diagram illustrating examples of a shape of the hole 250 in each of cases where different kinds of processing gases are used in the removing process. In FIG. 5, "Top" shows a transversal cross section of a top portion of the hole 250 penetrating the multilayered film 202, and "Bottom" illustrates a transversal cross sectional of a bottom portion of the hole 250 penetrating the multilayered film 202. In the following, the hole 250 penetrating the multilayered film 202 is simply referred to as "hole 250."

If $Ar/O_2$ is used as the processing gas for the removal of the reaction product in the removing process, the roundness of the hole 250 is deteriorated at the bottom portion of the hole 250. It is deemed to be because the reaction product remains in the recess 251 as it is difficult to remove the reaction product containing silicon, which adheres to the recess 251 of the second silicon oxide film 202a, when the $Ar/O_2$ gas is used in the removing process.

In contrast, if $CF_4$ is used as the processing gas for the removal of the reaction product in the removing process, as in the present exemplary embodiment, degradation of the roundness of the hole 250 at the bottom portion thereof is suppressed. That is, if the $CF_4$ is used as the processing gas for the removal of the reaction product in the removing process, the shape of the hole 250 can be improved, as compared to the case where the $Ar/O_2$ is used. It is deemed to be because the reaction product containing silicon, which adheres to the recess 251 of the second silicon oxide film 202a, can be efficiently removed when the $CF_4$ is used in the removing process.

Further, the comparative example of FIG. 5 is mainly performed under the following conditions, except for the processing gas for the removal of the reaction product.

Figure 6:
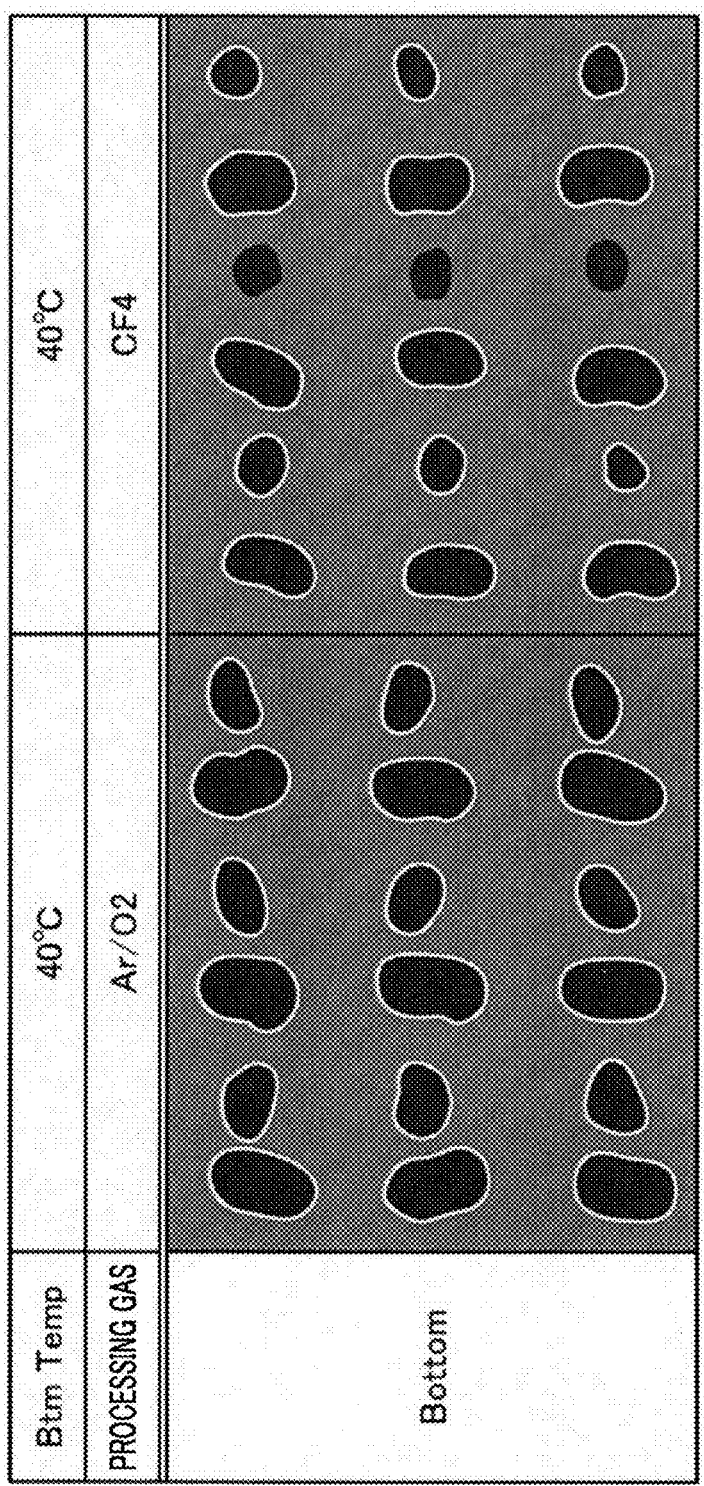
FIG. 6 is a diagram illustrating examples of the hole shape in each of cases where the different processing gases are used when the removing process is performed after changing a temperature of a lower electrode.

Internal pressure of the processing chamber 1: 300 mT
First high frequency power supplied to lower electrode: 400 W
Second high frequency power supplied to lower electrode: 0 W
Processing gas and flow rate: $Ar/O_2$=300 sccm/200 sccm
Temperature of lower electrode: 60° C.
Processing time: 6 sec FIG. 6 is a diagram illustrating examples of the shape of the hole 250 in each of cases where the different processing gases are used when performing the removing process after changing the temperature of the lower electrode. In FIG. 6, "Bottom" shows a transversal cross section of the bottom portion of the hole 250, the same as in FIG. 5. Further, in FIG. 6, "Btm Temp" indicates the temperature of the lower electrode. Processing conditions of FIG. 6 are the same as those of FIG. 5 except that the temperature of the lower electrode is changed from 60° C. to 40° C.

In the removing process, in case that the Ar/$O_2$ is used in the state that the temperature of the lower electrode is set to be 40° C., the roundness of the hole 250 at the bottom portion of the hole 250 is found to be deteriorated.

In contrast, in case that the $CF_4$ is used in the removing process in the state that the temperature of the lower electrode is set to be 40° C., the deterioration of the roundness of the hole 250 at the bottom portion of the hole 250 is suppressed.

As stated above, according to the present exemplary embodiment, the recess having the depth smaller than the thickness of the silicon oxide film is formed by etching the silicon oxide film by the plasma; the reaction product adhering to the recess is removed by the plasma of the fluorocarbon gas; and the hole penetrating the corresponding silicon oxide film is formed by plasma-etching the recess from which the reaction product is removed. Thus, according to the present exemplary embodiment, the deterioration of the roundness of the hole which penetrates the silicon oxide film can be suppressed. Further, by etching the film formed under the silicon oxide film, it is possible to obtain the hole having the desirable shape. As a result, the shape of the hole can be improved.

Moreover, the present disclosure is not limited to the above-described exemplary embodiment and can be modified in various ways within the scope of the present disclosure.

By way of example, in the above-described exemplary embodiment, the wafer W has the multilayered film 202 formed on the Si substrate 201. However, the structure of the wafer W is not limited thereto. By way of example, a single-layered silicon oxide film may be formed on the Si substrate 201. In this case, the control unit 60 forms a recess having a thickness smaller than a thickness of the single-layered silicon oxide film by etching the single-layered silicon oxide film by the plasm in the recess forming process.

Furthermore, in the above-described exemplary embodiment, the plasma etching apparatus is configured as the CCP type plasma etching apparatus. However, any of various types of plasma sources may be applied to the plasma etching apparatus. By way of non-limiting example, the plasma source used in the plasma etching apparatus may be inductively coupled plasma (ICP), radial line slot antenna, electron cyclotron resonance plasma (ECR), helicon wave plasma (HWP), or the like.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:
1. A plasma etching method, comprising:
a recess forming process of forming a recess having a depth smaller than a thickness of a first silicon oxide film by etching the first silicon oxide film by a first plasma generated from a first processing gas, wherein a silicon-containing reaction product is formed by the first plasma and adhered to the recess in the recess forming process;
a removing process of removing the silicon-containing reaction product by a second plasma generated from a second processing gas; and
a penetrating process of forming a hole penetrating the first silicon oxide film by etching the recess, from which the silicon-containing reaction product is removed, by the first plasma until a film formed under the first silicon oxide film is exposed,
wherein the first processing gas and the second processing gas contain a fluorocarbon gas, and
a flow rate of the fluorocarbon gas of the second processing gas is larger than a flow rate of the fluorocarbon gas of the first processing gas.
2. The plasma etching method of claim 1,
wherein the recess forming process and the removing process are alternately repeated multiple times until a depth of the recess reaches a preset depth, and thereafter
the penetrating process is performed.
3. The plasma etching method of claim 1,
wherein the film formed under the first silicon oxide film is a first silicon nitride film.
4. The plasma etching method of claim 3, further comprising:
a first extending process of extending the hole by etching, with a third plasma generated from a third processing gas, the first silicon nitride film and a second silicon oxide film formed under the first silicon nitride film, and
a second extending process of further extending the hole by etching, with a fourth plasma generated from a fourth processing gas, a second silicon nitride film exposed through the extended hole and a third silicon oxide film formed under the second silicon nitride film.
5. The plasma etching method of claim 1,
wherein the fluorocarbon gas is $CF_4$, $C_3F_8$, $C_4F_8$ or $C_4F_6$.
6. The plasma etching method of claim 1,
wherein in the recess forming process, the removing process and the penetrating process, a first high frequency power and a second high frequency power having a lower frequency than the first high frequency power are applied.
7. The plasma etching method of claim 6,
wherein a power of the second high frequency power applied in the removing process is smaller than a power of the second high frequency power applied in the recess forming process.
8. The plasma etching method of claim 1,
wherein the removing process is performed in a state of a higher temperature than the recess forming process.
9. The plasma etching method of claim 1,
wherein the fluorocarbon gas contained in the first processing gas is different from the fluorocarbon gas contained in the second processing gas.
10. The plasma etching method of claim 9,
wherein the fluorocarbon gas contained in the first processing gas is $C_4F_6$ and the fluorocarbon gas contained in the second processing gas is $CF_4$.

11. The plasma etching method of claim 1,
wherein the first processing gas is $C_4F_6$, CO and $O_2$, and the second processing gas is $CF_4$.

12. The plasma etching method of claim 1,
wherein the second processing gas does not contain $O_2$ and Ar.

13. The plasma etching method of claim 1,
wherein the second processing gas consists of the fluorocarbon gas.

14. The plasma etching method of claim 4,
wherein in the first extending process and the second extending process, a first high frequency power and a second high frequency power having a lower frequency than the first high frequency power are applied.

15. The plasma etching method of claim 14,
wherein a power of the second high frequency power applied in the first extending process is smaller than a power of the second high frequency power applied in the second extending process.

16. The plasma etching method of claim 4,
wherein the first silicon oxide film is thicker than the second silicon oxide film, the third silicon oxide film, the first silicon nitride film and the second silicon nitride film.

17. The plasma etching method of claim 4,
wherein the third processing gas is $C_4F_8$, $CH_2F_2$ and Ar, and the fourth processing gas is $C_4F_8$, $CH_2F_2$, Ar and $O_2$.

* * * * *